US006939476B1

(12) United States Patent
Griffin

(10) Patent No.: US 6,939,476 B1
(45) Date of Patent: Sep. 6, 2005

(54) METHOD FOR REAL TIME METAL ETCH CRITICAL DIMENSION CONTROL

(75) Inventor: Justin Griffin, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/300,170

(22) Filed: Nov. 20, 2002

(51) Int. Cl.[7] .............................................. G01B 1/00
(52) U.S. Cl. ........................... 216/59; 216/84; 702/97; 702/170
(58) Field of Search ................... 702/97, 170, 179–184, 702/187; 216/59, 84

(56) References Cited

U.S. PATENT DOCUMENTS

| | | | | |
|---|---|---|---|---|
| 5,926,690 A | * | 7/1999 | Toprac et al. ................. | 438/17 |
| 6,148,239 A | * | 11/2000 | Funk et al. ..................... | 700/1 |
| 6,556,876 B1 | * | 4/2003 | Prosack et al. ................. | 700/50 |
| 6,606,738 B1 | * | 8/2003 | Bell et al. ....................... | 716/21 |
| 6,625,497 B2 | * | 9/2003 | Fairbairn et al. ............... | 700/1 |
| 6,625,512 B1 | * | 9/2003 | Goodwin ..................... | 700/121 |
| 2003/0045098 A1 | * | 3/2003 | Verhaverbeke et al. ..... | 438/689 |
| 2003/0054573 A1 | * | 3/2003 | Tanaka et al. .................. | 438/4 |

* cited by examiner

Primary Examiner—Allan Olsen
(74) Attorney, Agent, or Firm—Stallman & Pollock LLP

(57) ABSTRACT

The present invention predicts Critical Dimension (CD) before processing a wafer lot and alters the etch by adjusting recipe inputs to control the current lots bias to target critical dimensions. Also, the process incorporates the use of etch chamber selection by an automated system, disallowing processing of a lot if critical dimensions are predicted to be out of control. Line caper, the angle of sidewall on the metal line, and oxide loss, the amount of oxide removed by the over etch portion of the process, are also used to monitor current tool performance and make adjustments to recipe inputs.

3 Claims, 6 Drawing Sheets

METHOD FOR REAL TIME METAL ETCH CRITICAL DIMENSION CONTROL

TECHNICAL FIELD OF THE INVENTION

The present invention relates to integrated circuit fabrication techniques and, in particular, to an integrated circuit fabrication method that incorporates critical dimension control using recent historical outputs together with current etch chamber performance data.

DEFINITIONS

As used herein, the following terms shall have the stated meaning:

CD: Critical Dimension.

Develop Inspect Critical Dimension (DICD): The line width of a photoresist mask pattern prior to etching.

Final Inspect Critical Dimension (FICD): The line width of the final etched line in an integrated circuit structure.

Bias: The difference between the Develop Inspect Critical Dimension (DICD) and the Final Inspect Critical Dimension (FICD).

Reticle: A mask used to impart an image onto a wafer surface; the mask contains the integrated circuit device design specifics.

Lot: A tracking number given to a quantity of integrated circuit wafers that travel together through a manufacturing process.

Cpk: process capability ratio.

TUV: software package for measuring process capability (commercially available from TUV Rheinland of North America.

BACKGROUND ON THE INVENTION

The fabrication of semiconductor integrated circuits requires an increasingly expensive and integrated set of tightly controlled processes to obtain the desired critical dimensions (CD) of the physical integrated circuit features within acceptable product yield. This is particularly true with respect to the control of the etching of metal lines within the integrated circuit structure.

Current metal etch tool performance monitoring uses a standard set of recipes. FIG. 1 provides a flow chart of the conventional control process. As shown in FIG. 1, the process begins at step 102 with an initial measurement of photoresist mask width at the base of the pattern to determine whether the wafer lot passes the DICD test. If the lot passes DICD, then the DICD data is sent to the wafer fabrication data collection system. Next, at step 104, the wafer lot is loaded on the etcher and, at step 106, the wafer lot is etched according to a standard etch recipe typically used for this particular metal layer in the device design. The etch end point time and the RF counter for the etch tool, i.e., the "age" of the tool, are recorded in a file and a file name is given to the wafer lot. Then, at step 108, the wafer lot is cleaned with a solvent to remove etch process by-products. Finally, the wafer lot is measured for FICD's, the FICD's are recorded in the lot file and a bias, based upon the difference between the FICD and the DICD for the lot, is calculated and used as a monitor of tool performance.

This conventional method of control suffers from the disadvantages that every wafer lot etches somewhat differently and etch tool performance changes with time.

SUMMARY OF THE INVENTION

The present invention provides the ability to target FICD's to account for inherent variability in incoming conditions and chamber level specifics due to the age of the etch chamber and other subtle differences. The invention provides both real time control of the etch process through an automated system that does not rely on human intervention and the ability to track etch tool performance based upon expected/predicted results.

The features and advantages of the present invention will be more fully appreciated upon consideration of the following detailed description and the accompanying drawings that set forth an illustrative embodiment in which the principles of the invention are utilized.

DETAILED DESCRIPTION OF THE INVENTION

As discussed above, currently, metal line etch relies totally on DICD targeting to hit FIDC targets. In accordance with the present invention, bias targeting is used to provide an opportunity at the metal etch step to compensate for variability in incoming conditions such as DICD and to use the historical bias on a reticle/tool combination and the current etch tool performance to improve process control and, ultimately, Cpk and final wafer yields. That is, a method in accordance with the present invention uses subtle recipe changes to gases and/or power to move a reticle bias away from historical values to better target FIDC.

Figure 1:
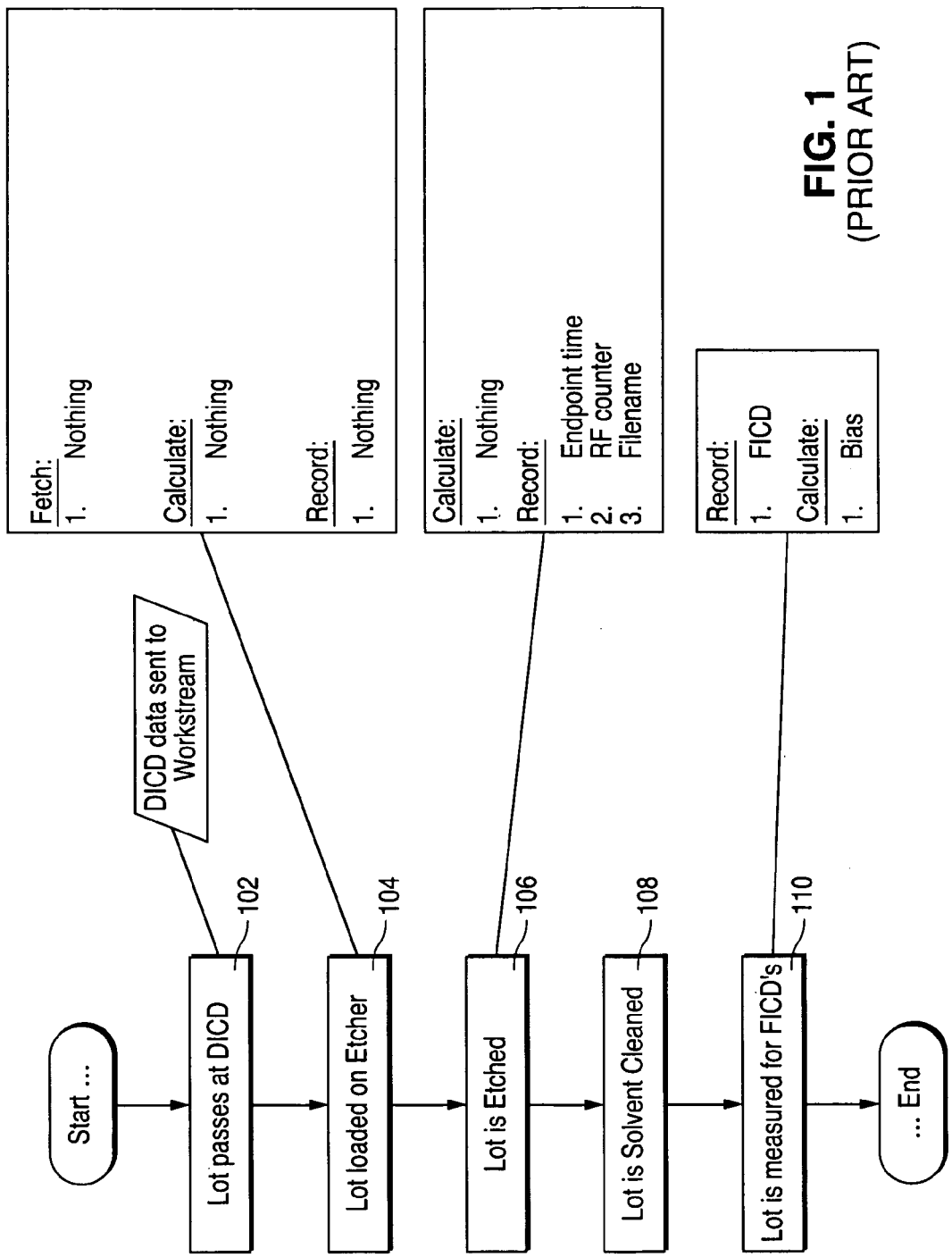
FIG. 1 is a flow chart illustrating a conventional metal etch control process.
Figure 2:
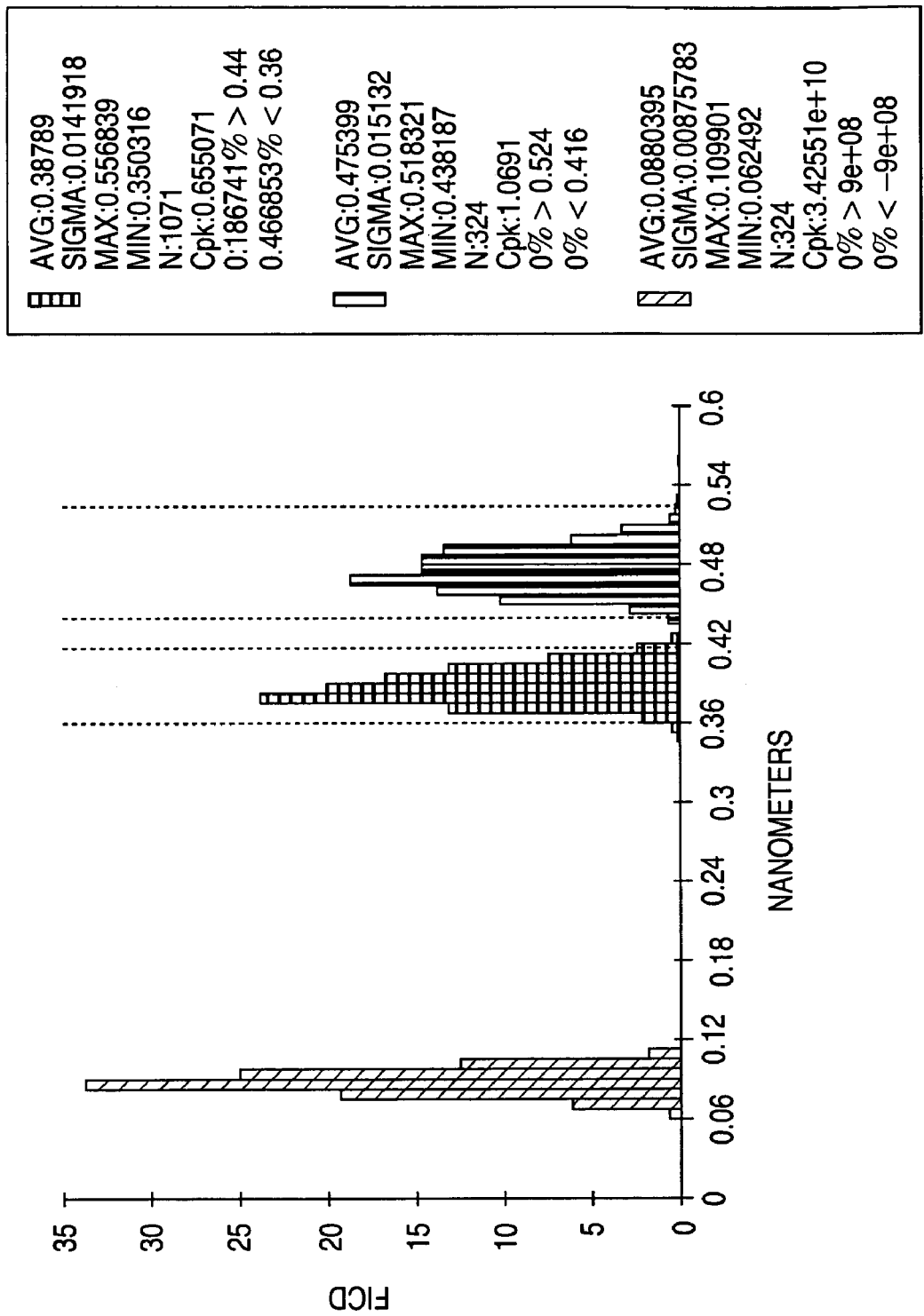
FIG. 2 is a histogram illustrating the bias distribution for a metal 3 layer in a CMOS process.

As can be seen from the FIG. 2 histogram, bias generally has a tighter distribution than DI and FI for a technology layer/combination (metal 3 in a CMOS process, in the case of FIG. 2). In this case, sigma is roughly 40% less than DI or FI. Using this predictability to account for variations in DICD, FICD can be tightened.

Figure 3A:
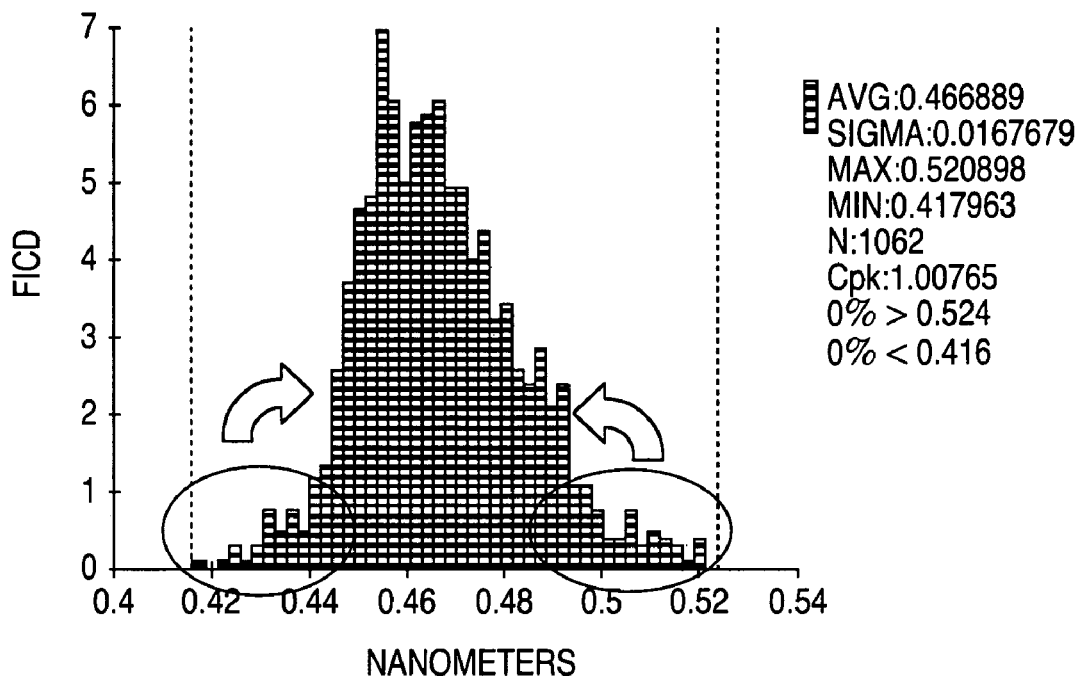
FIGS. 3A and 3B provide a more detailed view of FICD from the FIG. 2 histogram ans shows predicted benefits of utilizing a method in accordance with the present invention.
Figure 3B:
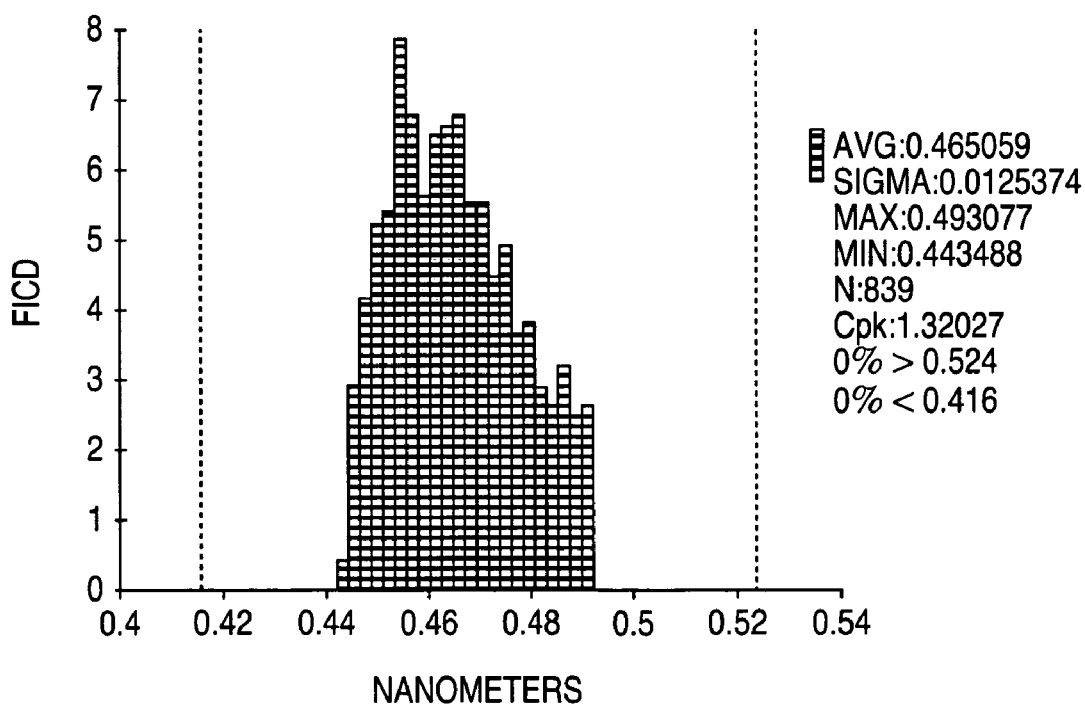

The FIG. 3 plot provides a more detailed view of FICD from the FIG. 2 histogram. Pictorially, the FIG. 3 graph shows that by eliminating the tails on the distribution, substantial gains can be made to Cpk. As shown in the FIG. 3 case, by moving the data in the circled tails closer to center of spec, Cpk increase from 1.00 to 1.33, a significant improvement.

Figure 4:
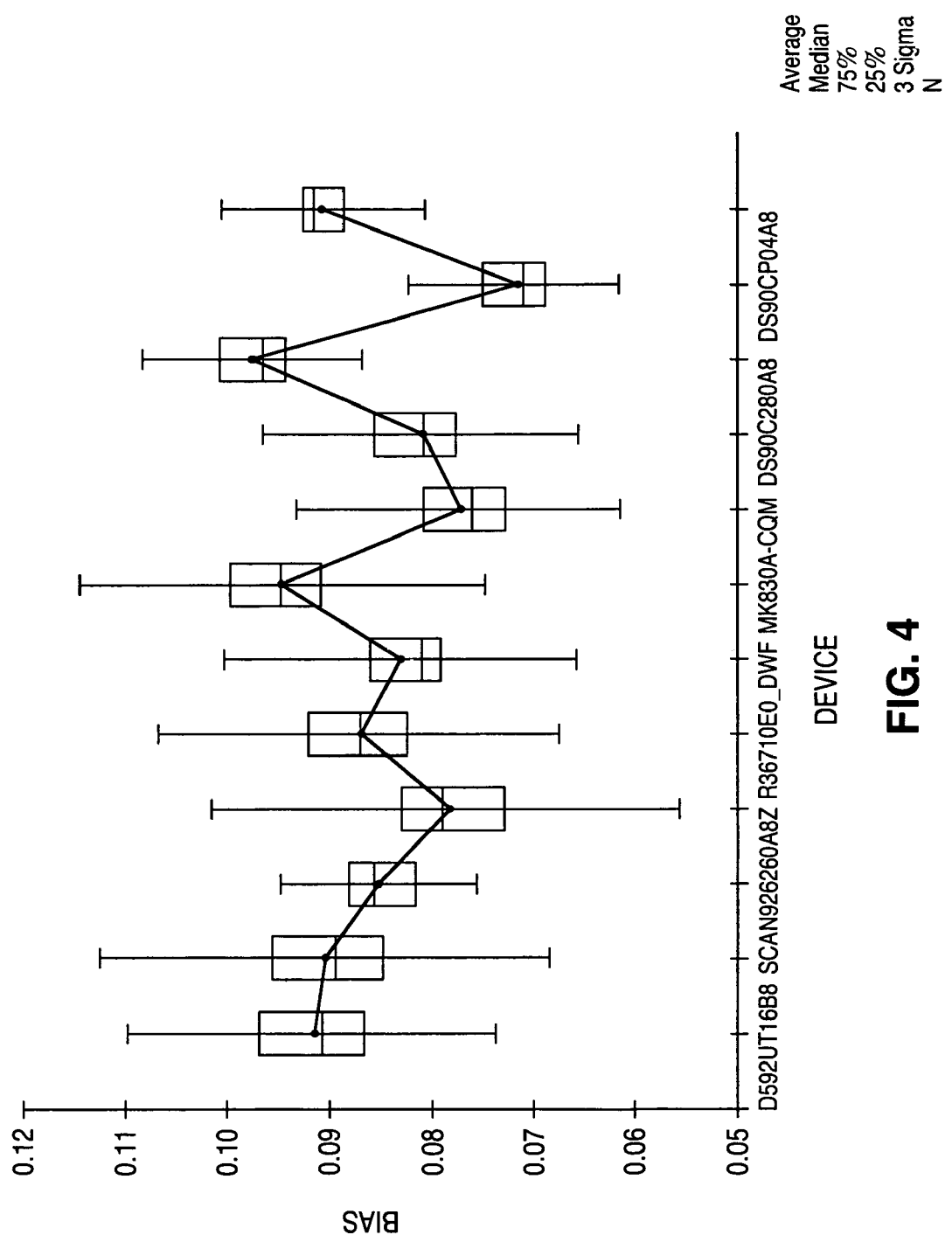
FIG. 4 is a box plot illustrating historical bias for a number of different reticles.

The FIG. 4 box plot shows why each reticle must be treated specifically. If the FIG. 2 histogram is taken down to box plots for individual reticles, it becomes easy to see that bias is very dependent upon reticle. The FIG. 4 plot shows twelve different devices and the bias they historically create. It can be seen that the average bias is anywhere from 0.073 um to 0.095 um based upon reticle.

An attempt is made to account for this reticle difference when the photoresist mask for the line is developed. However, there is always some variability in this process. If, at the actual etch step, for all lots where predicted FIDC is outside an acceptable range, an etch recipe is selected to modify the predicted bias to bring FIDC closer to target, this will provide a better Cpk and better process control.

Figure 5:
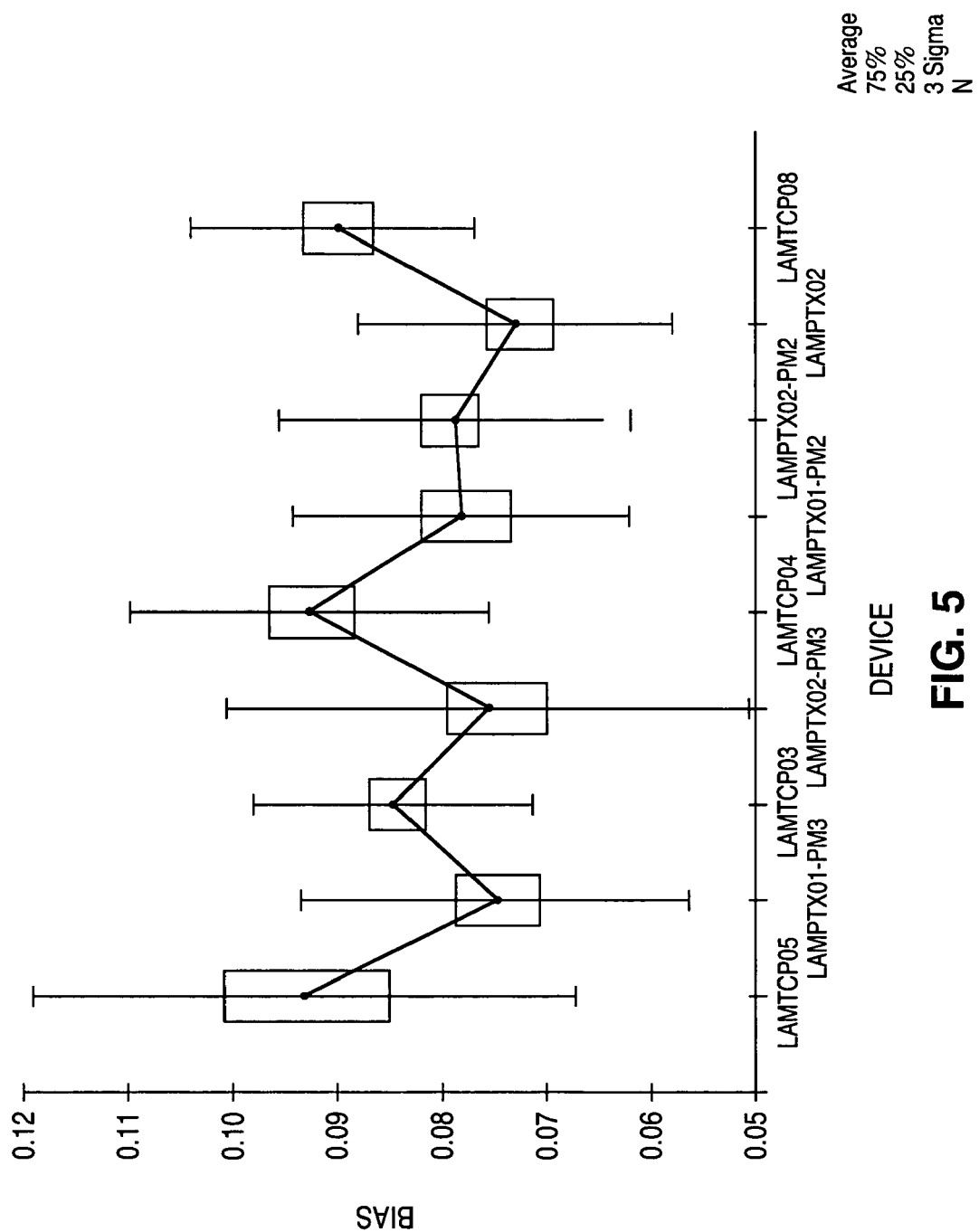
FIG. 5 concentrates on one device from the FIG. 4 box plot versus nine different etch chambers.

Referring to FIG. 5, which concentrates on only one device from the FIG. 4 box plot, i.e. device DS90C2501B8, versus nine different etch chambers, it can be seen that etch tool performance is also a very unique contributor to bias, and ultimately FICD. (It should be noted that the average bias from FIG. 4 and FIG. 5 is generated using the same recipe on the tool.)

For the foregoing reasons, a method in accordance with an embodiment of the present invention takes at least five factors into consideration when selecting an etch recipe: reticle, historical bias, tool, DICD and FICD target.

Figure 6:
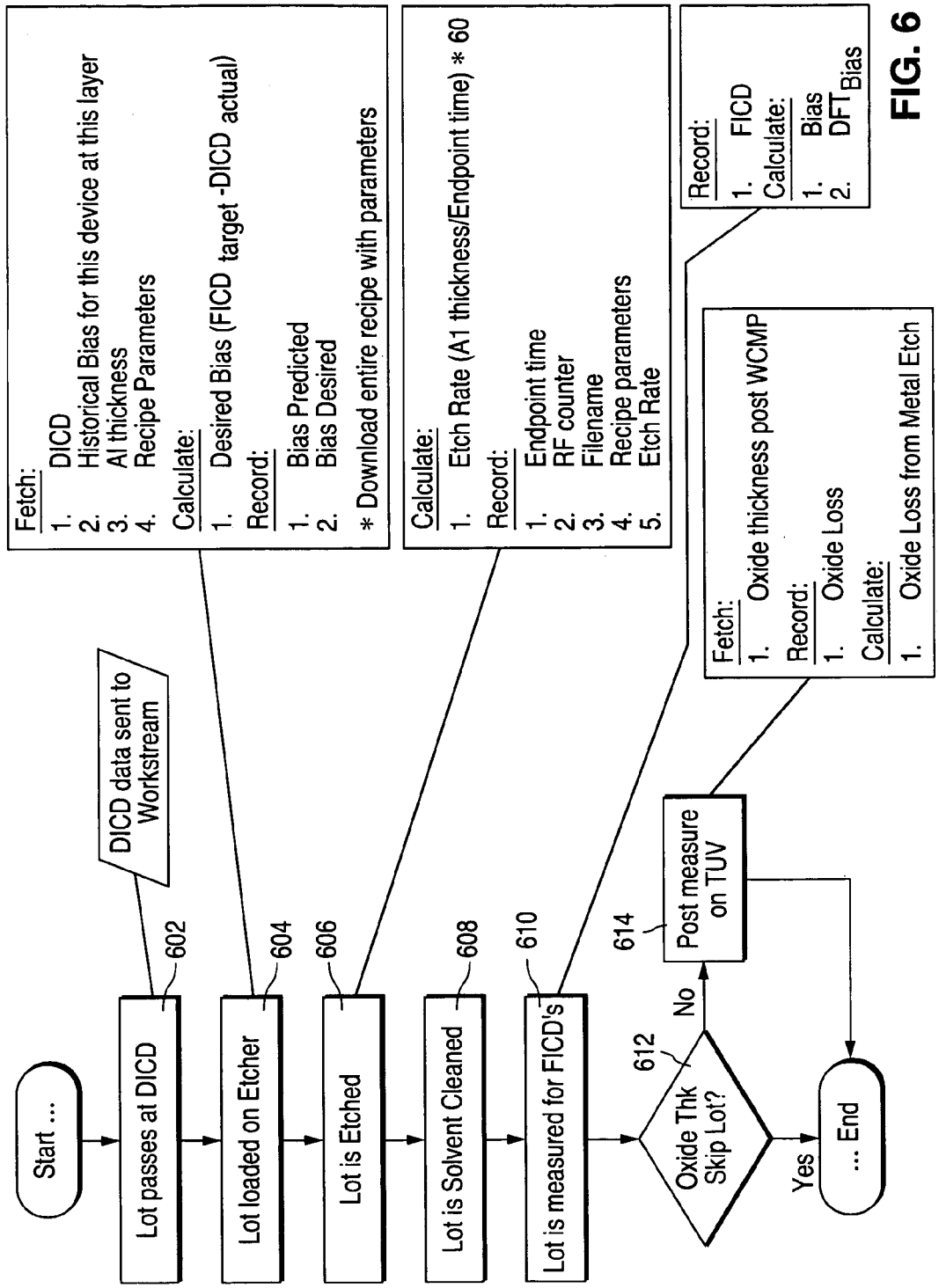
FIG. 6 is a flow chart illustrating a metal etch control process in accordance with the concepts of the present invention.

The FIG. 6 flow chart shows an embodiment of a real time metal etch critical dimension control process in accordance with the present invention. In accordance with the FIG. 6 process, at step 602, wafer lots are measured to determine whether they pass DICD, that is, whether the width of the photoresist line is within acceptable limits. If the wafer lot passes the DICD, then the DICD data is sent to the work stream. Next, at step 604, the wafer lot is loaded on a etcher. After loading the wafer lot on the etcher, data is fetched for use in the etch process. This data includes the DICD data, the historical bias for this device at this layer, the metal, e.g. aluminum thickness and recipe parameters for etching this particular metal. Also, a desired bias is calculated, wherein the desired bias equals a target FICD minus an actual DICD. Also, the predicted bias and the desired bias are recorded. Next, the recipe input parameters are downloaded to the tool and adjusted to accommodate all incoming conditions and current tool conditions, such as but not limited to DICD, historical bias and current etch tool performance. Current tool performance is determined based upon consideration of delta-from-target bias (DFTbias), end point (EP) time, oxide loss from recent lots and the ability to target bias from prior runs. As discussed below (step 610), preferably, DFTbias is calculated for every lot that is run; this data may then be used as a tool performance parameter to determine the recipe parameters to be downloaded. If the tool is currently running above or below predicted values for bias, then this is taken into consideration when selecting the recipe parameters. Following etch, at step 606, the end point time, the RF counter, the file name, the recipe parameters and the etch rate are all recorded. Then the wafer lot is solvent cleaned, at step 608. Then, at step 610, the wafer lot is measured for FICD's. This is the main data feedback step in the process wherein the FICD's are recorded and the actual bias is calculated together with a delta from target (DFT$_{bias}$), i.e. how far the actual bias is from the target bias. The taper angle is also observed and recorded against the lot history. Following measurement of FICD's and the recording and calculation of the above-indicated data, at step 612, the oxide thickness between the metal features is measured to determine the amount of oxide loss resulting from the overetch portion of the etch recipe. The process is then terminated, pending receipt of the next wafer lot. A post-measurement on TUV (step 614) is also used as a tool performance monitor.

If should be recognized that a number of variations of the above-identified embodiments of the invention will be obvious to one skilled in the art and in view of the foregoing description. Accordingly, of those specific embodiments and methods of the present invention shown and described herein, this invention is not to be limited by the specific embodiments. Rather, the scope of the invention is to be defined by the following claims and their equivalents.

What is claimed is:

1. A method of controlling an etch process in the processing of a current integrated circuit wafer lot utilizing a wafer processing tool, the method comprising:

determining whether the current integrated circuit wafer lot passes DICD;

controlling the wafer processing tool to etch the current integrated circuit wafer lot using information related both to historical etch performance of the wafer processing tool with respect to the processing of at least one integrated circuit wafer lot different than the current integrated circuit wafer lot and current wafer processing tool performance data related to the current integrated circuit wafer lot;

determining whether the etched current integrated circuit wafer lot passes FICD.

2. A method as in claim 1, and further comprising:

recording the measured FICD;

calculating bias and DFTbias for the etched current integrated circuit wafer lot.

3. A method of controlling an etch process in the processing of a current integrated circuit wafer lot utilizing an etching tool, the method comprising:

(i) determining whether the current integrated circuit wafer lot passes DICD;

(ii) loading the current integrated circuit wafer lot on the etching tool, the loading step including (iii) fetching DICD, bias, layer thickness and recipe parameters for the etching tool relating to historical performance of the etching tool with respect to the processing of at least one integrated circuit wafer lot different than the current integrated circuit wafer lot and to current etching tool performance with respect to the current integrated circuit wafer lot;

(iv) calculating desired bias parameters for etching the current integrated circuit wafer lot;

(v) recording predicted bias parameters for etching the current integrated circuit wafer lot and desired bias;

(vi) etching the current integrated circuit wafer lot, the etching step including calculating etch rate;

recording end point time, RF counter, file name, recipe parameters and etch rate;

(vii) solvent cleaning the etched current integrated circuit wafer lot; and (viii) measuring the solvent cleaned current integrated circuit wafer lot for FICD's, the measuring step including recording FICD;

calculating Bias and DFTbias.

* * * * *